United States Patent
Tohta et al.

(10) Patent No.: US 7,323,053 B2
(45) Date of Patent: Jan. 29, 2008

(54) PULLING-DOWN APPARATUS AND CONTAINER THEREFOR

(75) Inventors: Kazushige Tohta, Tokyo (JP); Kou Onodera, Tokyo (JP); Takeshi Ito, Tokyo (JP); Tsuguo Fukuda, Sendai (JP); Akira Yoshikawa, Sendai (JP)

(73) Assignee: TDK Corporation, Tokyo (JP)

( * ) Notice: Subject to any disclaimer, the term of this patent is extended or adjusted under 35 U.S.C. 154(b) by 40 days.

(21) Appl. No.: 11/336,840

(22) Filed: Jan. 23, 2006

(65) Prior Publication Data

US 2006/0185580 A1 Aug. 24, 2006

(30) Foreign Application Priority Data

Jan. 26, 2005 (JP) ............................. 2005-017570

(51) Int. Cl.
*C30B 35/00* (2006.01)
(52) U.S. Cl. .................... 117/218; 117/14; 117/73; 117/203; 117/216; 117/902
(58) Field of Classification Search ............... 117/1
See application file for complete search history.

(56) References Cited

U.S. PATENT DOCUMENTS 6,036,775 A * 3/2000 Imaeda et al. ............. 117/214

FOREIGN PATENT DOCUMENTS

| EP | 1 170 403 A2 | 1/2002 |
|---|---|---|
| JP | 11-278994 | 10/1999 |
| JP | 2001-080999 | * 3/2001 |
| JP | 2001-80999 | 3/2001 |
| JP | 3521070 | 2/2004 |

OTHER PUBLICATIONS

B.M. Epelbaum, et al., "Microstructure of AI203/Y3AI5012 eutectic fibers grown by μ-PD method", Journal Crystal Growth, Elsevier, vol. 198-199, XP-004170900, Mar. 1999, pp. 471-475.
II Hyoung Jung, et al., "Growth of La3-xBaxTa0.5+x/2Ga5.5-x/2014 single crystals by the micro-pulling-down technique", Materials Letters, vol. 56, No. 6, XP-004389845, Nov. 2002, pp. 1069-1073.

* cited by examiner

Primary Examiner—Robert Kunemund
Assistant Examiner—Marissa W. Chaet
(74) Attorney, Agent, or Firm—Oblon, Spivak, McClelland, Maier & Neustadt, P.C.

(57) ABSTRACT

It is an object of the present invention to provide a pulling-down apparatus that can breed a crystal having good characteristics of scintillation. The apparatus retains in a container that can control an atmosphere a melting pot having a narrow hole at the bottom side thereof, an induction heating device, and a seed-holding device that holds a seed and is pulled down so that a crystal formed successively to the seed is pulled down. Concurrently, imaging devices are arranged that can pick up images of a solid-liquid interface between the crystal and a melt material, from different directions, and the seed-holding device can be travel along directions perpendicular to respective image pickup directions in a horizontal plane.

13 Claims, 5 Drawing Sheets

PULLING-DOWN APPARATUS AND CONTAINER THEREFOR

BACKGROUND OF THE INVENTION

1. Field of the Invention

The present invention relates to an apparatus for producing monocrystals utilized as medical scintillators or the like. More particularly, the present invention relates to a production apparatus that is utilized in producing monocrystals through the pulling-down method, especially through the rapid melt-growth method that is called the micro-PD method, and to a vacuum container provided in the production apparatus.

2. Related Background Art

So-called scintillator crystals having a characteristic of converting a radiant ray into light include, for example, oxide-system crystals such as LSO, GSO, and BGO and fluoride-system crystals such as GLF and GYF are known. When utilized as a medical scintillator, the crystals are required to have high fluorescence intensity and a short fluorescence lifetime. To date, it has been believed that, when the required characteristics are taken into consideration, oxide-system crystals are promising. The oxide-system crystals are obtained generally through the CZ method (so-called the Chokralsky method). However, the CZ method requires a process in which the temperature rises to 2000° C. or higher during the production; therefore, it costs much to build the production apparatus, and the time necessary for crystal growth is long. Accordingly, production costs are raised; therefore, it can be considered that the crystals obtained through the CZ method may hardly be suitable for mass production.

In this situation, the pulling-down method is known as a method in which, despite the small diameter of a crystal to be obtained, the time necessary for crystal growth is short, and, compared with the CZ method, the crystal is obtained at low costs and superior in crystallinity (Japanese Patent Application Laid-Open No. 2001-080999 (Japanese Patent No. 3521070) and Japanese Patent Application Laid-Open No. H11-278994). In the method, a monocrystal made of a melt material is obtained by providing in the middle portion of a melting pot for retaining a melt material a narrow hole ranging from the inside to the outside of the melting pot, making a seed crystal (referred to as a seed, hereinafter) contact the melt material that leaks through the narrow hole, and pulling down the seed concurrently with the crystallization of the melt material.

In the case where, through the pulling-down method, good crystallinity should be obtained, it is required to maintain the flattening of a solid-liquid interface. However, in the pulling-down method utilizing a melt material that leaks by gravity through a narrow hole, for example, there may be a problem in that, depending on the viscosity of the melt material, the melt portion is broken through its own weight, or the diameter of a monocrystal is rendered large due to so-called liquid dripping. Therefore, it is considered impractical to relax too much the temperature gradient at the solid-liquid interface as a crystal growth portion, or in the vicinity of the solid-liquid interface. In other words, in accordance with conditions such as the viscosity of the melt material, a certain degree of crystal-growth speed or seed-pulling-down speed is required to be maintained. It is considered that it is liable to be difficult to maintain the flattening of the solid-liquid interface under these conditions.

SUMMARY OF THE INVENTION

The present invention has been implemented in consideration of the foregoing issues and relates to a crystal-growth apparatus utilizing the pulling-down method; it is an object of the present invention to provide an apparatus, for the pulling-down method, that enables good crystal growth and a container optimally utilized in the apparatus. Moreover, it is also an object of the present invention to provide a pulling-down apparatus that enables strict control of an atmosphere and can produce a scintillator crystal having superior characteristics and the like and a container optimally utilized in the apparatus.

In order to solve the foregoing issues, a pulling-down apparatus, according to the present invention, including a melting pot having a narrow hole at the bottom side thereof, an induction heating device, arranged around the melting pot, for heating the melting pot, and a seed-holding device, extending vertically, for holding at the top end thereof a seed that contacts a melt material that flows out through the narrow hole and determines an crystal orientation for the melt material, is characterized by further including a vacuum container, having a plurality of observation windows through which a solid-liquid interface where the melt material is crystallized can be observed from different directions, for containing the melting pot, the induction heating device, and the seed-holding device and enabling air therein to be discharged, a driving mechanism for supporting the seed-holding device at the bottom end of the seed-holding device, configuring part of the inner wall of the vacuum container, and enabling the bottom end of the seed-holding device to be driven in different directions on a approximately horizontal plane, a pulling-down mechanism for supporting the driving mechanism and approximately vertically moving the seed-holding device, by way of the driving mechanism, and a plurality of imaging devices that are arranged outside the respective plurality of observation windows and whose image-pickup light axes correspond with the respective different directions, and characterized in that the respective image-pickup light axes of the imaging devices are perpendicular on an approximately horizontal plane to the respective driving directions in which the bottom end of the seed-holding device is driven on the approximately horizontal plane.

In addition, in the pulling-down apparatus described above, it is preferable that, in the case where the seed-holding device is driven on an approximately horizontal plane, the driving directions are two directions that are perpendicular to each other. Additionally, it is preferable that the vacuum container includes a vacuum chamber for configuring an inner wall that is spaced a predetermined distance apart from the melting pot as an approximate center and a vacuum bellows that is vertically expandable and contractible and contains the seed-holding device extending vertically. In this case, it is further preferable that the inner wall of the vacuum container includes a material having corrosion resistance to a fluorine-system gas.

In order to solve the foregoing issues, a container, according to the present invention, containing a melting pot having a narrow hole at the bottom side thereof, an induction heating device, arranged around the melting pot, for heating the melting pot, and a seed-holding device, extending vertically, for holding at the top end thereof a seed that contacts a melt material that flows out through the narrow hole and determines an crystal orientation for the melt material, and enabling air in the inner space thereof to be discharged, is characterized by including a vacuum chamber, having a plurality of observation windows through which a solid-liquid interface where the melt material is crystallized can be observed from different directions, for configuring an inner wall that is spaced a predetermined distance apart from the melting pot as an approximate center, a vacuum bellows, for containing part of the seed-holding device, that is vertically expandable and contractible and has an approximately cylindrical shape, and whose top end is coupled with the vacuum chamber, at a place that is situated below and coaxially with the melting pot, and a driving mechanism, having a closing plane that closes the bottom side of the vacuum bellows, for supporting the seed-holding device at the bottom end of the seed-holding device and enabling the bottom end of the seed-holding device to be driven in different directions on a approximately horizontal plane, and characterized in that, with respect to the center axis of the melting pot, the respective directions in which the observation windows are formed are perpendicular on an approximately horizontal plane to the respective driving directions in which the bottom end of the seed-holding device is driven on the approximately horizontal plane.

According to the present invention, it is possible to monitor from a plurality of directions the solid-liquid interface between the melt material and the crystal, or the orientation of the crystal in an initial stage of growth, and to move in parallel the seed-holding device in respective directions perpendicular to the monitoring directions. In other words, when it is observed that the monitored solid-liquid interface has a gradient of a micro angle, or that the orientation of the crystal is deviated, the gradient is corrected by moving the seed-holding device, in parallel with the direction perpendicular to the monitoring direction, i.e., horizontally. By arranging the monitoring device and the correcting device that form a pair, the gradient of the solid-liquid interface or the integrity of the crystal orientation can be corrected even in the case where the pulling-down speed for the seed is high, whereby good crystallinity can be obtained.

In addition, in an apparatus disclosed in Japanese Patent Application Laid-Open No. 2001-080999 (Japanese Patent No. 3521070), by pivoting the seed-holding device as termed in the present invention, the occurrence of a dead angle for the solid-liquid interface is prevented even in the case where only a single imaging device is utilized. Additionally, the gradient of the solid-liquid interface is corrected by utilizing a gonio XY table. However, in order to, in the foregoing configuration of an apparatus, suppress the gradient of the solid-liquid interface and even a bend or distortion down to a certain degree or less, it is necessary that, compared with the pulling-down speed of the seed-holding device, the pivoting speed of the seed-holding device is set sufficiently high. In this case, shearing force always acts on the solid-liquid interface; therefore, the shearing force may adversely affect the crystal growth. Moreover, it is difficult to raise beyond a certain degree the pulling-down speed for the seed-holding device; for example, a melt material having low viscosity cannot be addressed.

According to the present invention, by picking up images of the solid-liquid interface from a plurality of directions, the dead angle is eliminated. Moreover, in the case where a gradient, a bend, or distortion, of the solid-liquid interface occurs, provision is made for the occurrence to be instantaneously found. Still moreover, by moving in parallel the seed-holding device in respective directions perpendicular on a horizontal plane to the image-pickup light axes, provision is made for an initial gradient to be readily and effectively corrected. By approximately concurrently applying the corrective operations to a plurality of image-pickup light axes, provision is made for a gradient of the solid-liquid interface to be rapidly and securely corrected even though the seed-holding device is merely moved in parallel. Accordingly, the pulling-down speed for the seed axis can be raised, whereby even a melt material having low viscosity can be utilized. Furthermore, shearing force to the solid-liquid interface can be made to be a critical mass; therefore, compared with a crystal, disclosed in Japanese Patent Application Laid-Open No. 2001-080999 (Japanese Patent No. 3521070), that is obtained under shearing force, a crystal can grow under a perfectly natural environment. Therefore, a crystal having superior characteristics can be obtained.

In addition, according to the present invention, by arranging inside an enclosed container main parts of an apparatus, making the inside of the container high-vacuum, and then fulfilling the container with a predetermined gas, the atmospheric environment during crystal breeding is controlled. Accordingly, the purity of gasses incorporated in an atmosphere can be controlled with high accuracy. Accordingly, effects can be demonstrated in which the uniformity of inner-monocrystal characteristics is enhanced, the unevenness in characteristics of each monocrystal is prevented, and change in characteristics during crystal breeding is prevented; therefore, high-quality monocrystals can stably be provided. Moreover, according to the present invention, change of a predetermined growth condition related to an atmosphere, for example, creation of an atmosphere, consisting of oxygen, that contains nitrogen at a predetermined percentage, can readily be implemented; therefore, control of an atmosphere can be carried out in accordance with the characteristics of a crystal to be obtained.

In a conventional apparatus utilizing the pulling-down method, a raw material is heated in the normal air pressure. Therefore, various kinds of heating methods can be utilized. However, it is an object of the present invention to enable also the heating of a raw material in a low-pressure environment or in a high-vacuum environment. Therefore, a raw material is heated through the induction-heating method that does not require any heating medium such as gas. Accordingly, the raw material can directly be heated, whereby heat loss is small, and heating efficiency is high. Moreover, high-speed heating and high-temperature heating are enabled, and temperature control is also facilitated. Still moreover, because the self-heating of a melting pot and the like are utilized, scale and the like are less likely to occur; therefore, the environment in the container can optimally be maintained for a long time.

The above and other objects, features, and advantages of the invention will become more apparent from the following detailed description taken in conjunction with the accompany drawings.

DETAILED DESCRIPTION OF THE PREFERRED EMBODIMENTS

Figure 1:
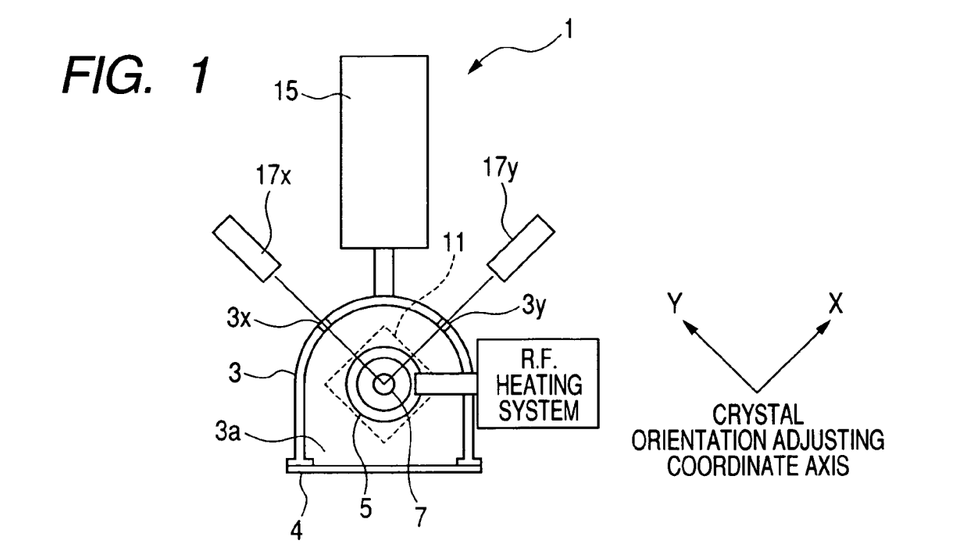
FIG. 1 is a plan view schematically illustrating a configuration of a pulling-down apparatus viewed from above according to an embodiment of the present invention.
Figure 2:
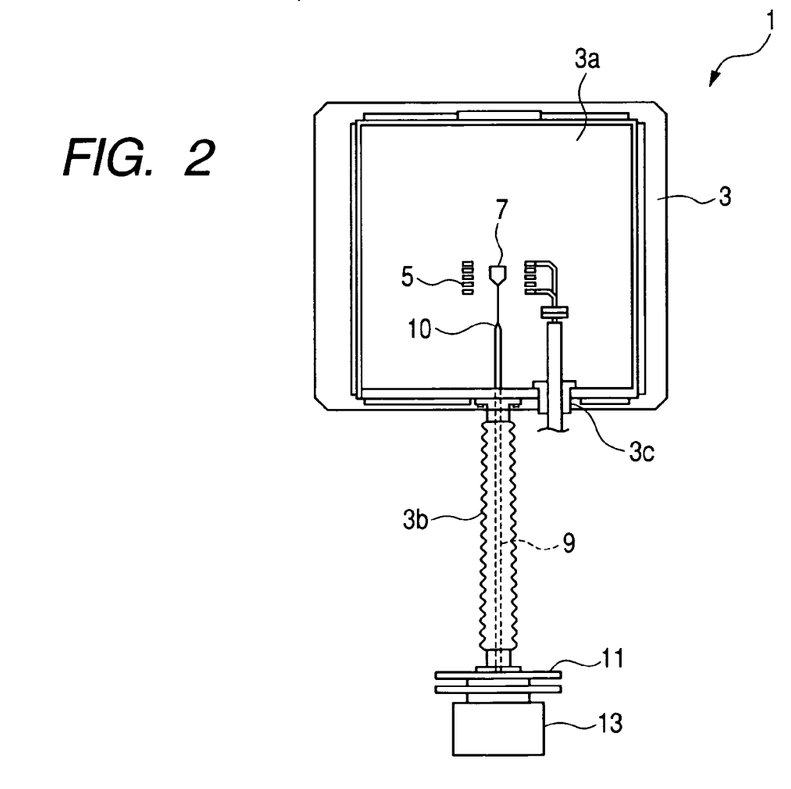
FIG. 2 is an elevation view schematically illustrating a configuration of the pulling-down apparatus viewed from front in FIG. 1.

An embodiment of the present invention will be explained below with reference to the drawings. FIG. 1 illustrates a schematic plan view of a pulling-down apparatus according to an embodiment of the present invention. FIG. 2 illustrates a schematic configuration, of a pulling-down apparatus, in a cross section taken vertically. A pulling-down apparatus 1 according to the embodiment includes a vacuum chamber 3, a heating coil 5 arranged inside the vacuum chamber 3, a melting pot 7 arranged concentric with the heating coil 5, a seed-holding device 9 (refer to FIG. 2) that can be driven coaxially with the heating coil 5 and the melting pot 7, an XY table 11 for supporting the seed-holding device 9, and a pulling-down mechanism 13 (refer to FIG. 2) for supporting the seed-holding device 9 and the XY table 11. In this situation, the heating coil 5 configures an induction heating device, and the XY table 11 configures a driving mechanism for the seed-holding device 9.

The vacuum chamber 3 is an approximately columnar chamber including the top and bottom sides each having a shape obtained by cutting an ellipse along its short axis; an open side 3a is a flat plane. On the open side 3a, a door 4 is mounted in an openable and closable manner; the air-tightness of the vacuum chamber 3 is kept by means of an unillustrated sealing member arranged along an abutting portion where the peripheral portion of the open side 3a and the door 4 contact each other. In addition, the vacuum chamber 3 has a jacket structure; by circulating coolant water inside the vacuum chamber 3, the temperature of the chamber itself is kept constant. The heating coil 5 and the melting pot 7 are arranged approximately in the center of the vacuum chamber 3, whereby the local heating of the structural wall and the door 4 of the vacuum chamber 3 is prevented. In other words, the vacuum chamber 3 is configured in such a way that the inner wall thereof is spaced a predetermined distance or more apart from the melting pot 7 that is situated approximately in the center of the vacuum chamber 3.

The vacuum chamber 3 has a small-diameter bellows 3b approximately vertically extending from the bottom side thereof. At the junction portion where the bellows 3b and the vacuum chamber 3 are joined, the internal circle of the bellows 3b, the heating coil 5, and the melting pot 7 are concentric. The seed-holding device 9 of an approximately rod shape extends in such a way as to penetrate along the center axis of the bellows 3b. The seed-holding device 9 retains a seed crystal 10 at the top end thereof and coupled with the XY table 11 at the bottom end thereof. The bottom end of the bellows 3b is also adhesively fixed on the top side of the XY table 11; a vacuum space is formed of the vacuum chamber 3, the door 4, the bellows 3b, and the top side of the XY table 11. The vacuum space is connected to a air-discharging system 15; by, through the air-discharging system 15, discharging air from the space, depressurization and pressurization of the space is controlled. The vacuum chamber 3 and the bellows (vacuum bellows) 3b, along with the XY 11 table that is adhered to the bellows, configure a container according to the present invention.

The XY table 11 is arranged in such a way that the reference position thereof is concentric with the heating coil 5 and the melting pot 7. The XY table 11 drives the seed-holding device 9 in a plane perpendicular to the center axis of the heating coil. In other words, the seed-holding device 9 can shift in parallel and horizontally. The XY table 11 is supported by the pulling-down mechanism 13, in such a way as to be movable vertically. Accordingly, the pulling-down mechanism 13 drives through the XY table 11 the seed-holding device 9, at a predetermined speed and vertically downward. The heating coil 5 consists of a metal pipe; by circulating water through the pipe, the coil itself is prevented from being heated excessively. In addition, the heating coil 5 is connected to a high-frequency oscillation device (an R.F. heating system in FIG. 1), or the like, outside the vacuum chamber, through an introduction hole, provided in the vacuum chamber 3, into which a seal member 3c is inserted.

The vacuum chamber 3 further includes observation windows 3x and 3y that enable observation, from different directions, of the solid-liquid interface between a melt material and a crystal, formed below the melting pot 7. Outside the observation windows, imaging devices 17x and 17y are arranged whose image-pickup light axes lead through the observation windows approximately to the center portion of the foregoing solid-liquid interface. The solid-liquid interface exists in a space surrounded by the heating coil 5. Therefore, the respective image-pickup light axes of the imaging devices can move vertically in parallel; in an actual arrangement, the imaging devices are situated slightly shifted vertically. In addition, with respect to the melting pot 7, the respective image-pickup light axes coincide with respective directions in which the observation windows are formed.

Figure 3:
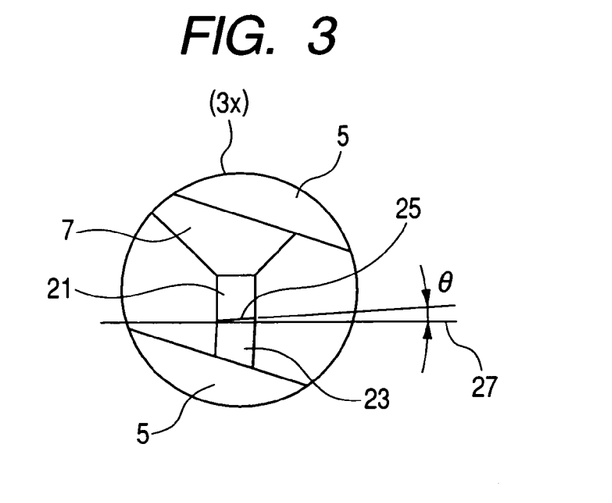
FIG. 3 is a view symbolically illustrating an image obtained through a imaging device $17x$.

The XY table 11 is designed to be movable in a direction (the X direction in FIG. 1) perpendicular, in a horizontal plane, to the image-pickup light axis of the imaging device 17x and in a direction (the Y direction in FIG. 1) perpendicular, in a horizontal plane, to the image-pickup light axis of the imaging device 17y. FIG. 3 symbolically illustrates an image obtained through the imaging device 17x. Through a gap between the windings of the heating coils 5, the melt material 21 leaking through a narrow hole provided at the bottom end of the melting pot 7 and a crystal 23 obtained through phase transformation, of the melt material 21, across a solid-liquid interface 25 are observed. Through the image, the angle θ between a horizontal plane 27 and the solid-liquid interface 25 is obtained.

In the case where the gradient, of the solid-liquid interface 25, that has been neglected increases further, not only good crystallinity cannot be obtained, but also a crack in the crystal may occur in an extreme case. In the present invention, by shifting the seed-holding device 9 in parallel with a direction perpendicular to the image-pickup light axis to correct the gradient so as to be horizontal, conditions are secured under which the crystal stably grows. Moreover, by obtaining images from a plurality of directions (in the present embodiment, two directions perpendicular to each other), the condition of the entire solid-liquid interface can be understood without pivoting the seed-holding device 9. Still moreover, by making a pair of the image-pickup light axis and the direction in which, in order to correct the solid-liquid interface obtained through that image-pickup light axis and the light axis, the seed-holding device is shifted, provision is made for rapidly addressing the occurrence of the gradient of the solid-liquid interface. Accordingly, even in a pulling-down method in which the growth speed of a crystal is high, it is possible to readily maintain the condition of good crystal growth.

Furthermore, in the present invention, by making the chamber wall of the vacuum chamber 3 jacket-structure to enable water cooling of the chamber wall, provision is made for keeping the temperature of the chamber wall relatively low even if the distance between the heat source and the chamber wall is short. Still furthermore, the vacuum bellows 3b configures a space for containing the seed-holding device 9, including the area in which the seed-holding device 9 is driven. By implementing the arrangement described above, a critical mass of space is required to be air-discharged. Moreover, a high-vacuum pump is arranged in the air-discharging system. As a result, it is possible to obtain a high vacuum of the attainable air pressure down to $10^{-4}$Pa; therefore, conditions during the production of a crystal, such as an atmosphere, can be more stabilized.

In this situation, it is known that, compared with an oxide-system crystal, a fluoride-system crystal can be obtained at a temperature range around 1000° C. However, to date, no technology for introducing a fluorine atom into an optimal position within a crystal lattice has been established; therefore, it has been considered difficult to obtain a fluoride-system crystal having good crystallinity. In the present invention, high-corrosion-resistance SUS316 is utilized for the inner wall of the vacuum chamber 3, the bellows 3b, and the like, and Kanigen plating is applied to the surface of the heating coil. As a result, an atmosphere of a fluorine-system gas such as CF4 can readily be formed. Moreover, because the introduction of a fluorine-system gas under the foregoing high-vacuum condition and the like are implemented, the occurrence of corrosion, e.g., due to the interaction between residual water and the like and the fluorine-system gas is prevented.

In consequence, crystal growth in the presence of a high-concentration fluorine-system gas is enabled, whereby optimal introduction of a fluorine atom into the crystal is enabled. More particularly, even in the pulling-down method in which the growth speed of a crystal is 100 or more times as rapid as that in the case of the CZ method, a fluorine-system crystal having good scintillator characteristics can be obtained. In addition, in the present embodiment, as a material exposed in a vacuum space, SUS316 or a Kanigen-plated material has been exemplified; however, the present invention is not limited to the foregoing materials, and any material having corrosion resistance to a fluorine-system gas or any material obtained by applying to an ordinary material the coating of a material, such as Teflon, having corrosion resistance may be utilized.

Figure 4:
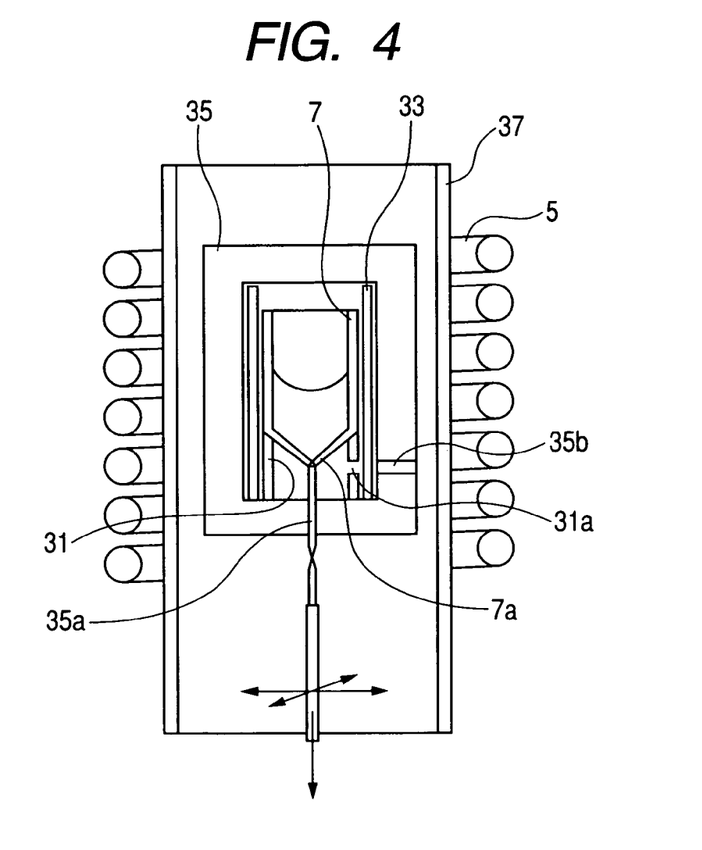
FIG. 4 is a view symbolically illustrating a configuration example of constituent elements arranged around a melting pot and a heating coil.

In addition, the actual melting pot 7 is not arranged alone inside the heating coil 5; by arranging a plurality of refractories around the melting pot 7, an even-temperature space is secured, the solid-liquid interface is formed at an appropriate position, and crystallinity is improved. FIG. 4 is a cross-sectional view of the heating coil 5 and the melting pot 7, including the refractories. A configuration example will be explained. As illustrated in FIG. 4, the approximately cylindrical melting pot 7 having a narrow hole 7a at the center of the bottom end thereof is supported by an after-heating portion 31 having the same diameter and wall thickness as those of the melting pot 7. The melting pot 7 and the after-heating portion 31 are contained in a holder 33 formed of a cylindrical non-conductive material. The holder 33 is further contained in a non-conductive heat shield 35 that is approximately closed at the top and bottom sides thereof. Additionally, the heat shield 35 is further contained in a cylindrical quartz tube 37; the heating coil 5 is arranged around the quartz tube 37. The melting pot 7, the holder 33, the heat shield 35, the quartz tube 37, and the heating coil 5 are each arranged concentric with one another. In addition, the quartz tube 37 is a member that can be utilized in the case where a subject to be bred is an oxide-system crystal, and it is preferable that, in the case where a fluoride-system crystal is bred, the member is not utilized or the member consists of a material having corrosion resistance to fluorine.

Additionally, at the center of the bottom side of the heat shield 35, a through-hole 35a is formed through which the narrow hole 7a is accessible vertically from the lower side. The heat generation through induction heating is implemented with the melting pot 7 and the after-heating portion 31; through respective members arranged around the melting pot 7 and the after-heating portion 31, the foregoing effects described above, such as improvement of heating efficiency and increase in the even-temperature space, are obtained. In the present embodiment, in the side walls of the after-heating portion 31 and the heat shield 35, the respective through-holes 31a and 35b for observing the solid-liquid interface are formed. In addition, the holder 33 and the quartz tube 37 are transparent materials; therefore, the foregoing through-holes are not formed.

The configuration described with reference to FIG. 4 is eventually an example; it is preferable that the configuration is appropriately altered in accordance with a heating temperature, the size of the even-temperature space, the setting position of the solid-liquid interface, or whether or not a heat shield for the inner wall of the vacuum chamber is required. Additionally, the melting pot 7 is required to be electrically conductive; as a material for the melting pot, various kinds of materials, such as carbon, Ir, Pt, Mo, and Re, can be utilized.

In the foregoing embodiment, two pairs of the imaging devices and the drive systems for horizontally driving the respective imaging devices are arranged in such a way as to be perpendicular to each other; however, the present invention is not limited to the present embodiment. Two pairs are arranged from the view point of eliminating the dead angle in the image-pickup region during crystal growth; in this case, however, it is conceivable that a region may exist that is not included in both picked-up videos, whereby the case occurs in which abnormal crystal growth in that region cannot be addressed. In this case, an imaging device may be arranged that can include that region within the image-pickup angle thereof. In this situation, a drive system corresponding to the added imaging device may additionally be provided. Moreover, in the case where the image-pickup light axis of the added imaging device is made identical to that of the existing imaging device, and the imaging devices are arranged at respective positions in such a way as to be symmetrical to one another with respect to the melting pot, a configuration may be employed in which the melting pot can be driven only in X and Y directions described above.

In the present invention, the XY table is utilized that horizontally moves the seed-holding device in the direction corresponding to each imaging device. However, the present invention is not limited to the foregoing embodiment; instead of the XY table, for example, a gonio XY table disclosed in Japanese Patent Application Laid-Open No. 2001-080999 (Japanese Patent No. 3521070) may be utilized. In that case, the driving direction is set so as to be perpendicular to the image-pickup light axis of each corresponding imaging device. In this situation, unlike the foregoing embodiment, the gradient of solid-liquid interface is corrected by inclining the seed-holding device. With that configuration, it is also possible to address abnormal crystal growth in the solid-liquid interface, and to significantly reduce shearing force to the solid-liquid interface, thereby enabling a crystal having superior characteristics to be obtained.

In the case where the XY table is replaced, e.g., by a gonio XY table, the direction in which the seed-holding device is driven exists not in the XY plane but, e.g., in a plane that is incorporated within a sphere having a radius equal to the distance between the solid-liquid interface and the surface of the gonio XY table. Therefore, it is preferable that the plane on which the seed-holding device is driven is defined as an approximately horizontal plane. In addition, assuming that the direction of driving by the gonio XY table is the driving direction at the portion where the seed-holding device is fixed on the table, it can be said that the driving direction is in a perpendicular relationship with either one of the image-pickup light axes. Therefore, the driving portion is defined at the bottom portion of the seed-holding device.

In addition, in the present embodiment, an image obtained through the imaging device is observed, and then the XY table 11 is driven by operating the unillustrated driving device. However, in mass production of crystals, it is preferable that respective images obtained through the imaging devices are treated through a known image analysis method to compute respective driving amount for the XY table, and the XY table 11 is automatically operated based on the results of the computation.

Figure 5:
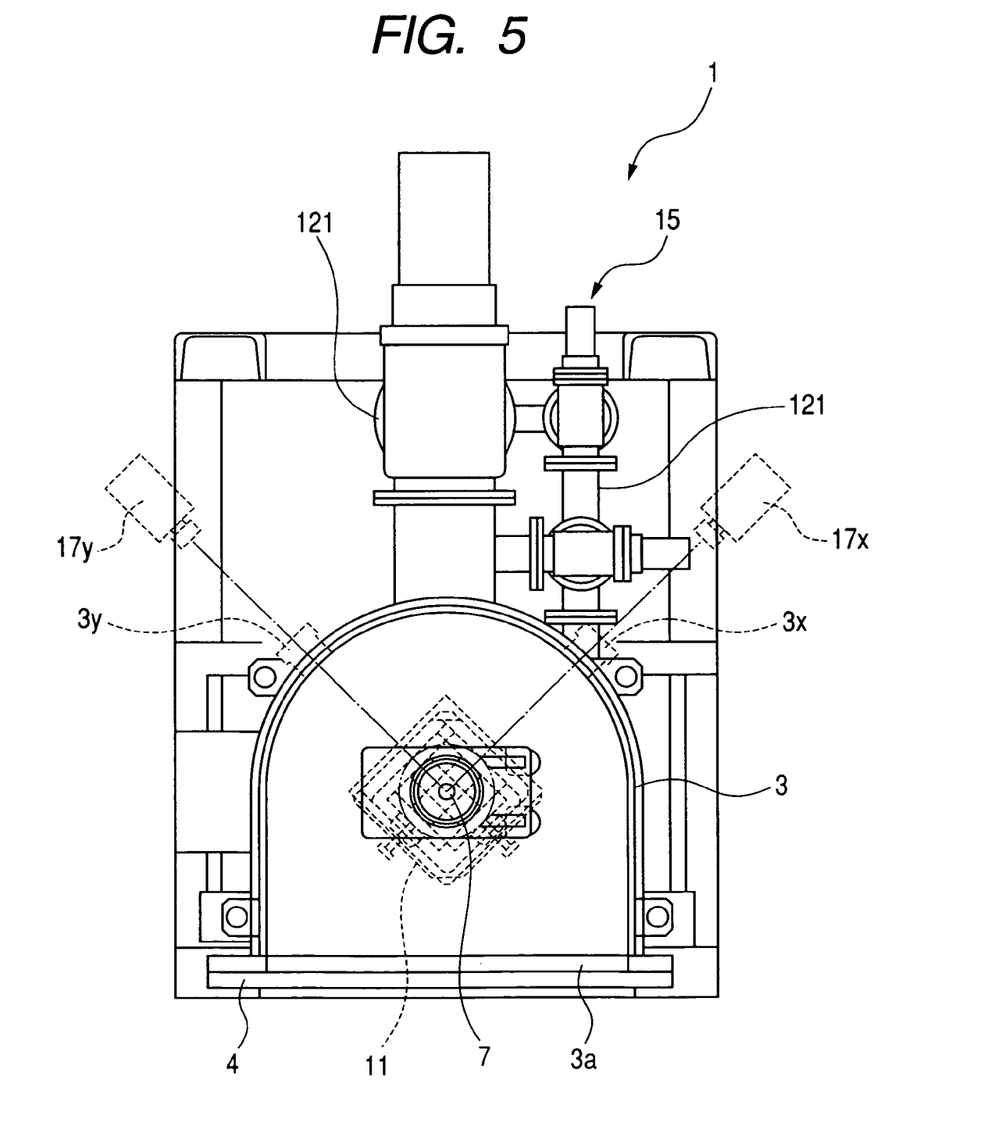
FIG. 5 is a plan view with partial cross sectional views, illustrating a configuration of a pulling-down apparatus according to the present example in the case where the pulling-down apparatus is viewed from above.
Figure 6:
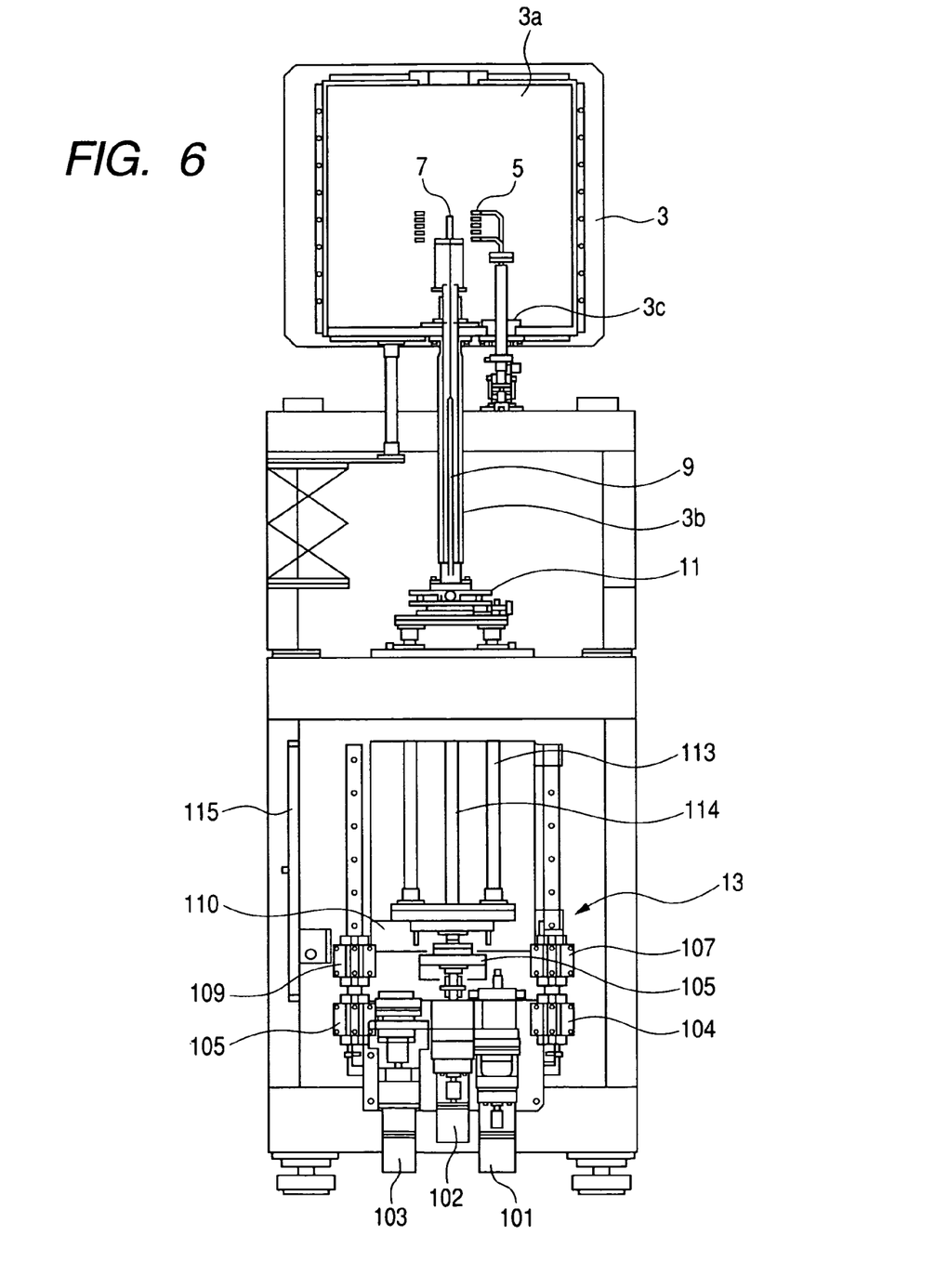
FIG. 6 is an elevation view with partial cross sectional views, illustrating a configuration of a pulling-down apparatus according to the present example in the case where the pulling-down apparatus is viewed from front.
Figure 7:
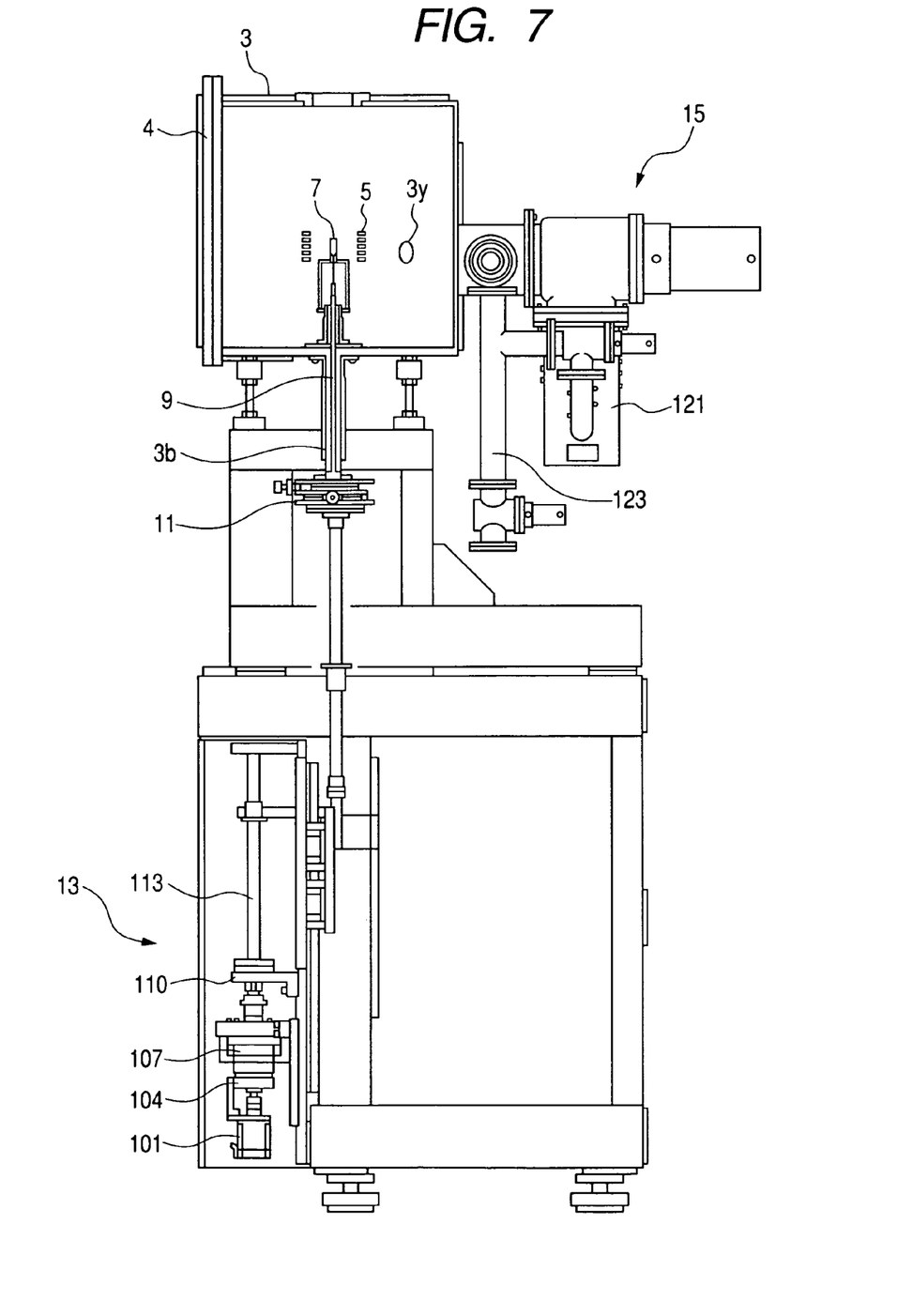
FIG. 7 is a side view with partial cross sectional views, illustrating a configuration of a pulling-down apparatus according to the present example in the case where the pulling-down apparatus is viewed from side.

Next, an example of a pulling-down apparatus in which the present invention is embodied will be explained with reference to the drawings. In addition, constituent elements having the same actions and effects as those described in the foregoing embodiment are designated by the same reference characters, and detailed explanations therefore will be omitted. FIG. 5 is a plan view with partial cross sectional views, illustrating a configuration of a pulling-down apparatus according to the present example in the case where the pulling-down apparatus is viewed from above. FIG. 6 is an elevation view with partial cross sectional views, illustrating a configuration of a pulling-down apparatus according to the present example in the case where the pulling-down apparatus is viewed from front. FIG. 7 is a side view with partial cross sectional views, illustrating a configuration of a pulling-down apparatus according to the present example in the case where the pulling-down apparatus is viewed from side.

As is the case with the foregoing embodiment, the pulling-down apparatus 1 according to the present example includes the vacuum chamber 3, the heating coil 5 arranged inside the vacuum chamber 3, the melting pot 7 arranged concentric with the heating coil 5, the seed-holding device 9 (refer to FIG. 2) that can be driven coaxially with the heating coil 5 and the melting pot 7, the XY table 11 for supporting the seed-holding device 9, and the pulling-down mechanism 13 (refer to FIG. 2) for supporting the seed-holding device 9 and the XY table 11. In addition, the XY table 11 can be driven by an unillustrated driving mechanism independently in the X direction or the Y direction that are perpendicular to each other on the top side of the XY table 11.

The vacuum chamber 3 is an approximately columnar chamber including the top and bottom sides each having a shape obtained by cutting an ellipse along its short axis; the open side 3a is a flat plane. On the open side 3a, the door 4 is mounted in an openable and closable manner; the airtightness of the vacuum chamber 3 is kept by means of an unillustrated sealing member arranged along an abutting portion where the peripheral portion of the open side 3a and the door 4 contact each other. The vacuum chamber 3 is coupled with the top side of the small-diameter bellows 3b approximately vertically extending from the bottom side thereof. The bottom end of the bellows 3b is adhesively fixed on the surface of the XY table 11; a vacuum space is formed of the vacuum chamber 3, the door 4, the bellows 3b, and the top side of the XY table 11. The vacuum space is connected to the air-discharging system 15; by, through the air-discharging system 15, discharging air from the inner space, depressurization and pressurization of the space is controlled.

The seed-holding device 9 is arranged in such a way as to penetrate the inside of the bellows 3b, and the bottom end thereof is fixed to the top side of the XY table 11. The XY table 11 drives the seed-holding device 9 in the X-axis and Y-axis directions that are perpendicular to each other in a horizontal plane. The XY table 11 is supported by the pulling-down mechanism 13, in such a way as to be movable vertically. Accordingly, the pulling-down mechanism 13 drives through the XY table 11 the seed-holding device 9, at a predetermined speed and vertically downward. The heating coil 5 is connected to an unillustrated high-frequency oscillation device outside the vacuum chamber, through an introduction hole, provided in the vacuum chamber 3, into which the seal member 3c is inserted.

The vacuum chamber 3 further includes the observation windows 3x and 3y that enable observation, from different directions, of the solid-liquid interface between a melt material and a crystal, formed below the melting pot 7. Outside the observation windows, the imaging devices 17x and 17y are arranged whose image-pickup light axes lead through the observation windows approximately to the center portion of the foregoing solid-liquid interface. The solid-liquid interface exists in a space surrounded by the heating coil 5. Therefore, the respective image-pickup light axes of the imaging devices can move vertically in parallel; in an actual arrangement, the imaging devices are situated slightly shifted vertically.

Here, the pulling-down mechanism 13 and the air-discharging system 15 according to the present example will be explained. In the pulling-down mechanism 13, a middle-speed servo motor 101 transmits through a speed reducer 104 and a clutch 107 the turning force to a gear system 110; a low-speed servo motor 102, through a speed reducer 105; and a high-speed servo motor 103, through a speed reducer 106 and a clutch 108. The upward-and-downward driving, of the XY stage 11, through the pulling-down mechanism 13 is implemented by further transmitting, through a converter formed of the gear system 110 and a ball-screw axel 114, to the ball-screw axel 114 the turning force that has been transmitted to the gear system 110. By, among the combinations of the servo motor and the speed reducer, selecting an appropriate combination, it is possible to obtain a pulling-down speed, for the XY stage 11, in accordance with the crystal-growth speed.

In addition, in the present example, the high-speed servo motor 103 and the accompanying speed reducer 106 are utilized in a process other than the actual pulling-down process, e.g., in seed-replacement work. However, the combination of a servo motor and a speed reducer is not limited to the foregoing combinations and speed range; it is desirable that, in accordance with production conditions for fibrous crystals, an appropriate servo motor and a speed reducer having an appropriate speed-reduction ratio are utilized.

In general, the rotating speed of a servo motor is feedback-controlled through detection of the rotation angle; however, unevenness in the rotating speed during reduction of the rotating speed, a lost motion due to backlash in the speed reducer or the like, and rotating-speed unevenness of the servo motor itself cannot be adjusted. In the present example, by directly detecting and measuring the upward and downward traveling amount of the XY stage 11, through a linear scale 115 mounted in parallel with the stage, and feeding back the traveling amount to the rotation of the servo motor, the pulling-down speed is stabilized.

Moreover, while monitoring the condition of crystal growth and measuring the diameter of the crystal every predetermined time period, the pulling-down speed may be changed as needed so that the diameter is within a predetermined range. In addition, the vertical-travel straightness of the foregoing pulling-down mechanism 13 is secured through a high-rigidity translatory guide 113.

The air-discharging system 15 is configured of an oil diffusion pump 121 and a rotary pump for initial air discharge (unillustrated). In order to form a vacuum space made up of the vacuum chamber 3 and the like, while appropriately switching the foregoing pumps, a vacuum pipeline 123 and unillustrated valves are arranged that appropriately connect the respective pumps. By utilizing the pumps sequentially and step by step, a desired high-vacuum space can be obtained. In addition, in order to obtain a higher degree of vacuum, a high-vacuum pump such as a turbomolecular pump may be added to the air-discharging system 15. Additionally, an unillustrated gas-supply system is connected to the vacuum chamber 3; through the gas-supply system, an atmosphere gas required during crystal growth is introduced into the vacuum space. Moreover, by controlling the opening of any one of the foregoing valves and the amount of gas supply, the pressure during crystal growth is controlled.

In addition, the foregoing pulling-down mechanism and the air-discharging system are no more than an example; it is desirable that the pulling-down mechanism and the air-discharging system are appropriately changed in accordance with the pulling-down speed, the operation pressure, the ultimate vacuum level, or the like. Additionally, as the shape of the vacuum chamber 3, the shape described in the present example has been employed which provides a maximal side-face opening, in view of securing a working space for replacing the melting pot, the seed crystal, the refractory, or the like, and implementing maintenance; however, the shape of a vacuum chamber according to the present invention is not limited to the present example, and it is desirable that the shape is appropriately changed in view of a heating condition, workability, productivity, or the like.

The foregoing explanation has been implemented based on the assumption that the present invention relates to an apparatus utilized in obtaining scintillation crystals. However, crystals obtained through an apparatus according to the present invention are not limited to a scintillation crystal; the present invention is applicable to the production of less-defect and high-quality fibrous materials such as silicon, lithium niobate (LN), lithium tantalate (LT), yttrium-aluminum garnet (YAG), sapphire, and a eutectic substance. More particularly, an apparatus according to the present invention can be utilized also for producing a fibrous crystal as a functional material utilized in the electronics field or in the optoelectronics field, or as a structural material utilized in a high-temperature environment; it has been difficult to produce these materials, through the FZ method, the Bridgman method, or the CZ method.

As many apparently widely different embodiments of the present invention can be made without departing from the sprit and scope thereof, it is to be understood that the invention is not limited to the specific embodiment thereof except as defined in the appended claims.

This application claims priority from Japanese Patent Application No. 2005-017570 filed Jan. 26, 2005, which is hereby incorporated by reference herein.

What is claimed is:

1. A pulling-down apparatus including a melting pot having a narrow hole at the bottom side thereof, an induction heating device, arranged around the melting pot, for heating the melting pot, and a seed-holding device, extending vertically, for holding at the top end thereof a seed that contacts a melt material that flows out through the narrow hole and determines a crystal orientation for the melt material, the pulling-down apparatus comprising:

a vacuum container, having a plurality of observation windows through which a solid-liquid interface where the melt material is crystallized can be observed from different directions, for containing the melting pot, the induction heating device, and the seed-holding device and enabling air therein to be discharged;

a driving mechanism for supporting the seed-holding device at the bottom end of the seed-holding device, configuring part of the inner wall of the vacuum container, and enabling the bottom end of the seed-holding device to be driven in different directions on an approximately horizontal plane;

a pulling-down mechanism for supporting the driving mechanism and approximately vertically moving the seed-holding device, by way of the driving mechanism; and a plurality of imaging devices that are arranged outside the respective plurality of observation windows and whose image-pickup light axes correspond with the respective different directions, wherein the respective image-pickup light axes of the imaging devices are perpendicular on an approximately horizontal plane to the driving directions in which the bottom end of the seed-holding device is driven on the approximately horizontal plane, and the solid-liquid interface is observed from the different directions by the plurality of imaging devices to obtain an angle between the horizontal plane and the solid-liquid interface, and the seed-holding device is shifted in parallel with a direction perpendicular to each image-pickup light axis on the basis of the angle without pivoting the seed-holding device so as to keen the solid-liquid interface horizontal.

2. The pulling-down apparatus according to claim 1, wherein, in the case where the seed-holding device is driven on an approximately horizontal plane, the driving directions are two directions that are perpendicular to each other.

3. The pulling-down apparatus according to claim 1, wherein the vacuum container includes a vacuum chamber for configuring an inner wall that is spaced a predetermined distance apart from the melting pot as an approximate center and a vacuum bellows that is vertically expandable and contractible and contains the seed-holding device extending vertically.

4. The pulling-down apparatus according to claim 1, wherein the inner wall of the vacuum container includes a material having corrosion resistance to a fluorine-system gas.

5. A container for containing a melting pot having a narrow hole at the bottom side thereof, an induction heating device, arranged around the melting pot, for heating the melting pot, and a seed-holding device, extending vertically, for holding at the top end thereof a seed that contacts a melt material that flows out through the narrow hole and determines an crystal orientation for the melt material, and enabling air in the inner space thereof to be discharged, the container comprising:

a vacuum chamber, having a plurality of observation windows through which a solid-liquid interface where the melt material is crystallized can be observed from different directions, for configuring an inner wall that is spaced a predetermined distance apart from the melting pot as an approximate center;

a vacuum bellows, for containing part of the seed-holding device, that is vertically expandable and contractible and has an approximately cylindrical shape, and whose top end is coupled with the vacuum chamber, at a place that is situated below and coaxially with the melting pot; and a driving mechanism, having a closing plane that closes the bottom side of the vacuum bellows, for supporting the seed-holding device at the bottom end of the seed-holding device and enabling the bottom end of the seed-holding device to be driven in different directions on an approximately horizontal plane, wherein with respect to the center axis of the melting pot, the respective directions in which the observation windows are formed are perpendicular on an approximately horizontal plane to the driving directions in which the bottom end of the seed-holding device is driven on the approximately horizontal plane, and the solid-liquid interface is observed from the different directions through the plurality of observation windows by a plurality of imaging devices to obtain an angle between the horizontal plane and the solid-liquid interface, and the seed-holding device is shifted in parallel with each driving direction on the basis of the angle without pivoting the seed-holding device so as to keep the solid-liquid interface horizontal.

6. The pulling-down apparatus according to claim 1, wherein the image-pickup light axes of the imaging devices are movable vertically.

7. An apparatus for producing monocrystals, said apparatus comprising:

a vacuum container having a plurality of observation windows provided at different radial locations about a vertical axis of said vacuum container;

a melting pot provided within said vacuum container, said melting pot having a narrow hole at a bottom side thereof;

an heating device provided within said vacuum container, said heating device being arranged around said melting pot;

a seed-holding device configured to hold a seed that contacts a melt material flowing approximately vertically out through the narrow hole;

a movable support attached to said seed-holding device, said support being movable in different directions along an approximately horizontal plane;

a pulling-down mechanism attached to said movable support, said pulling-down mechanism being configured to approximately vertically move said movable support and said seed-holding device; and a plurality of imaging devices arranged outside respective observation windows of said plurality of observation windows, said plurality of imaging devices are configured to observe a solid-liquid interface of the melt material flowing out through said narrow hole along respective image-pickup light axes from perspectives at the different radial locations, wherein said plurality of imaging devices are configured to determine an angle between the horizontal plane and the solid-liquid interface, and wherein said movable support is configured to move said seed-holding device in a direction parallel with a direction perpendicular to each image-pickup light axis based on the angle determined by said plurality of imaging devices without pivoting said seed-holding device so as to maintain the solid-liquid interface in a horizontal orientation.

8. The apparatus according to claim 7, wherein said movable support is movable in two perpendicular directions along a horizontal plane.

9. The apparatus according to claim 7, wherein said vacuum container includes a vacuum chamber, and wherein said melting pot and said heating device are provided at an approximate center of said vacuum chamber.

10. The apparatus according to claim 7, further comprising a vacuum bellows that houses at least part of said seed-holding device, said vacuum bellow being vertically expandable and contractible.

11. The apparatus according to claim 10, wherein said vacuum bellow has a top end that is coupled with said vacuum container at a location below and coaxial with said melting pot.

12. The apparatus according to claim 7, wherein said vacuum container has an inner wall that includes a material having corrosion resistance to a fluorine-system gas.

13. The apparatus according to claim 7, wherein said plurality of imaging devices are configured to be movable so that the image-pickup light axes thereof are vertically movable.

* * * * *